United States Patent [19]

Nogami

[11] Patent Number: 5,406,511
[45] Date of Patent: Apr. 11, 1995

[54] MASK ROM FOR STORING PLURAL-BIT DATA

[75] Inventor: Kazutaka Nogami, Palo Alto, Calif.

[73] Assignee: Kabushiki Kaisha Toshiba, Kawasaki, Japan

[21] Appl. No.: 104,443

[22] Filed: Aug. 10, 1993

[30] Foreign Application Priority Data

Aug. 11, 1992 [JP] Japan .................................. 4-214098

[51] Int. Cl.⁶ ............................................. G11C 11/24
[52] U.S. Cl. .................................... 365/149; 365/102
[58] Field of Search ................................ 365/102, 149

[56] References Cited

U.S. PATENT DOCUMENTS 5,020,025  5/1991  Nix et al. ............................. 365/102

OTHER PUBLICATIONS

*Three-Dimensional Capacitor Read Only Storage.* S. A. Abbas. IBM Disclosure Bulletin. vol. 10, No. 7, Dec. '67.

*Primary Examiner*—Eugene R. LaRoche
*Assistant Examiner*—Christopher R. Glombocki
*Attorney, Agent, or Firm*—Spensley Horn Jubas & Lubitz

[57] ABSTRACT

Memory cells are formed at mutually facing areas of conductive layers arranged in parallel in a lateral direction and conductive layers arranged in a direction orthogonal to the lateral direction. A plurality of capacitors are formed, as a matrix array, at those mutually facing area of the conductive layers crossing relative to each other in the mutually orthogonal relation. Each capacitor constitutes a memory cell. A plurality of capacity levels, each, are set as a corresponding capacitor level by varying a mutually facing area between the conductive layers.

13 Claims, 4 Drawing Sheets

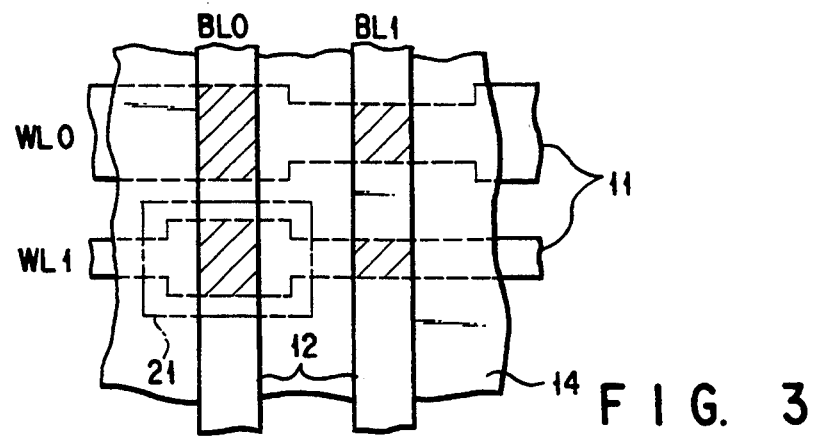
FIG. 3
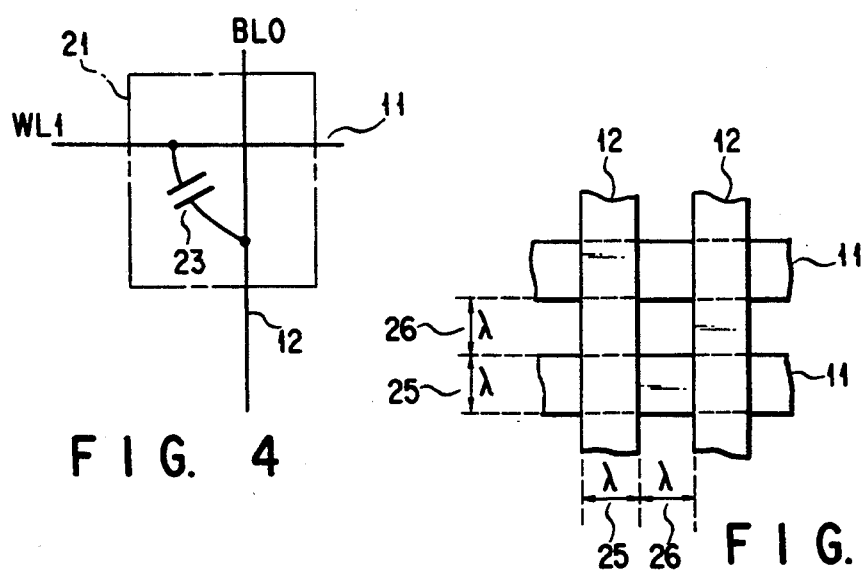
FIG. 4
FIG. 5
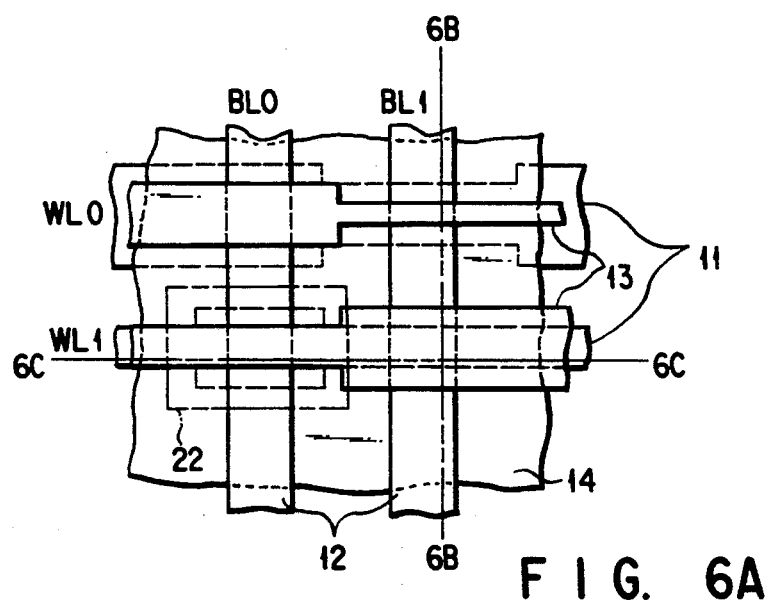
FIG. 6A

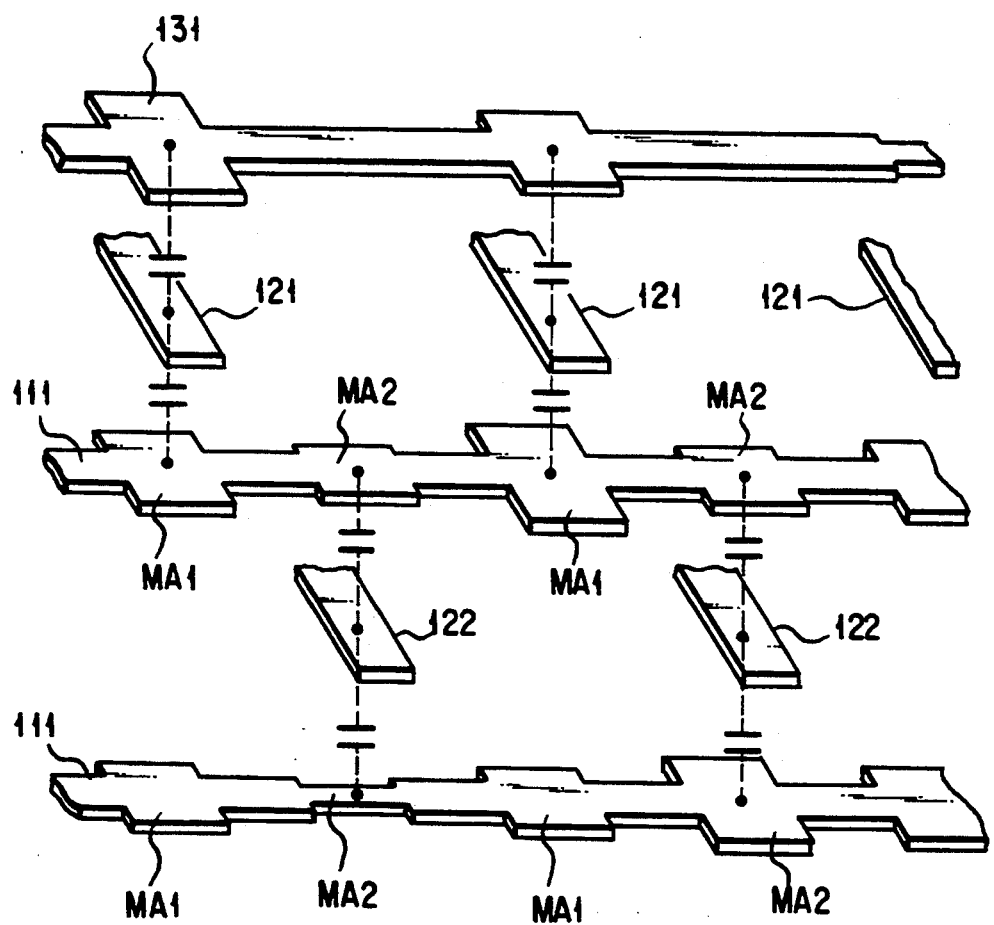
F I G. 9

MASK ROM FOR STORING PLURAL-BIT DATA

BACKGROUND OF THE INVENTION

1. Field of the Invention

The present invention relates to a mask ROM (read only memory) and, in particular, to a memory cell structure for a large-capacity mask ROM for storing a plural-bit data ($2^n$ data).

2. Description of the Related Art

Generally a large-capacity mask ROM stores, in its memory cells, binary data "1" and "0" such as the presence or absence of transistors, of an impurity implanted into channel regions and of contacts.

FIGS. 1 and 2, each, show a memory cell array of a conventional mask ROM and FIGS. 1 and 2 show a NOR type and NAND type structure, respectively. These arrangements allow "1" and "0" to be programmed by the presence or absence of an implanted impurity for the formation of channel regions.

In FIGS. 1 and 2, gate electrodes 52 are formed over active regions 51 overlying a semiconductor substrate and a gate insulating film, not shown, is formed between the gate electrode 52 and the active region 51. Conductive layers 54 are formed over an insulating interlayer, not shown, which covers the gate electrode 52 and active region 51. The end portion of the active region 51 makes contact with the conductive layer 54 via a corresponding contact hole 53.

In FIGS. 1 and 2, a system is adopted which stores one bit in each MOS transistor by implanting an impurity ion opposite in conductivity type to that of the active region 51 and controlling a threshold level involved.

In the arrangement shown above, a cell area for storing one bit depends upon the technique for the manufacture of transistors. Therefore, a large-capacity mask ROM can be achieved by reducing the cell size as indicated by a broken line in FIGS. 1 and 2. If the downsizing of cells reaches a design limit, a problem is involved that an achievable mask ROM capacity will be limited. That is, it has been difficult, therefore, to implement a still larger-capacity mask ROM.

SUMMARY OF THE INVENTION

It is accordingly the object of the present invention to provide a mask ROM capable of reducing its perbit cell areas without using the manufacturing technique of transistors.

According to the present invention there is provided a mask ROM for storing plural-bit data, comprising:

first conductive layer means arranged in parallel array in a first direction;

second conductive layer means arranged in parallel array in a second direction orthogonal to the first direction;

insulating film means for insulating the first and second conductive layer means from each other; and memory cell means for defining a matrix array of capacitors formed at those mutually facing areas of the first and second conductive layer means and each having a capacity level created by varying a mutually facing area of the first and second conductive layers, each memory cell constituting the memory cell.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of he invention.

FIG. 3 is a plan view of a pattern showing a mask ROM memory cell structure according to a first embodiment of the present invention;

FIG. 4 is an equivalent circuit diagram showing part of the memory cell structure of FIG. 3;

FIG. 5 is a plan view of a pattern showing respective minimal values on which a memory cell size is determined;

FIGS. 6A to 6C are views showing a mask ROM memory cell structure according to another embodiment of the present invention;

FIG. 9 shows conductive layers and capacitor formation memory cell areas of FIG. 8.

DETAILED DESCRIPTION OF THE PREFERRED EMBODIMENTS

Figure 1:
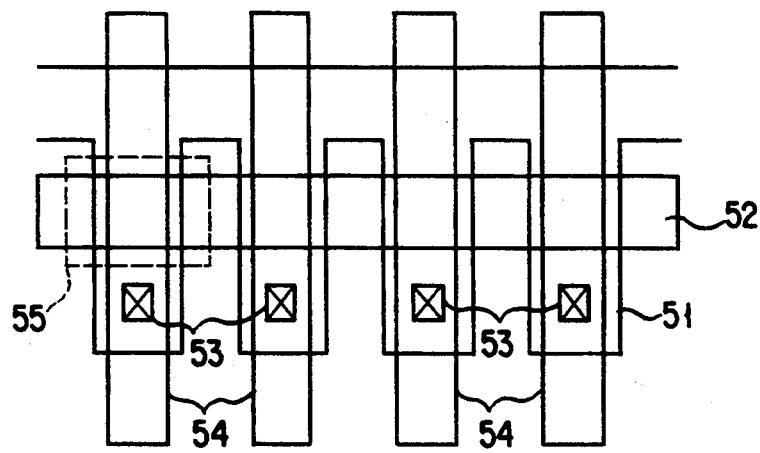
FIG. 1 is a plan view of a pattern showing a conventional mask ROM memory cell (NOR type) structure.
Figure 2:
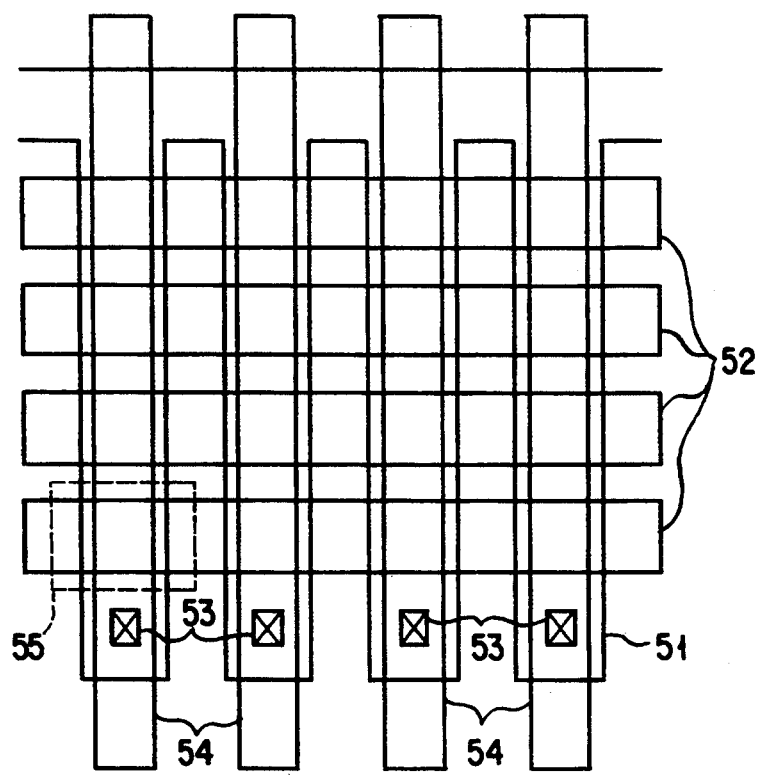
FIG. 2 is a plan view of a pattern showing a conventional mask ROM memory cell (NAND type) structure.

The embodiment of the present invention will be explained below with reference to the accompanying drawings.

FIG. 3 is a plan view of a pattern showing an arrangement of memory cell areas of a mask ROM according to one embodiment of the present invention. The memory cell matrix above includes conductive layers 11 arranged in parallel in a lateral direction and conductive layers 12 arranged in a non-direct contact relation in a direction orthogonal to the lateral direction. That is, an insulating film 14 is formed between the conductive layers 11 and 12 and such capacitors are located at these areas between the crossing conductive layers 11 and 12 to provide a capacitor matrix.

The individual capacitor serves as a memory cell and the capacity level of the individual capacitor can be set to one of as a plurality of different levels by varying the area of the capacitor formed between the facing portions of the conductive layers 11 and 12. Examples of four different capacity capacitors are indicated by the hatched regions in FIG. 3. In this way, it is possible to store plural-bit data in one memory cell (capacitor).

In FIG. 3, one of the memory cells is indicated by a dash-dot line 21 and its equivalent circuit is shown in FIG. 4. How many bits of data may be stored in the individual memory cell is determined by the number of different capacity levels the capacitors 23 have. If the capacitor may take, for example, one of 16 different capacity levels, then it follows that the one memory cell (capacitor 23) is capable of storing 4 bits of data.

Reading the data out of the memory cell is achieved as follows. The lateral conductive layer 11 is selected as a word line (WL0, WL1 . . . ) to vary its potential level. The corresponding crossing conductive layer 12 is selected as a bit line (BL0, BL1 . . . ). When the potential on the word line (WL0, WL 1, . . . ) is increased, charge is transferred through capacitive coupling to the bit line (BL0, BL1, . . . ) in accordance with the capacity of the capacitor at the intersection of the word line and the bit line. The potential on the bit line associated with that capacitor is determined by the capacity of the capacitor so that measuring the potential on the bit line (BL0, BL1) allows the capacity of the capacitor to be determined. By so doing it is possible to read the data out of the corresponding cell.

The capacity of the capacitor also varies, taking into condition a process variation when the capacitor is formed as a memory cell. In order to correctly detect the capacity level of the cell even when the capacity of the capacitor varies, it is considered effective to provide a reference cell. In this case, it is possible to detect the level of an ordinary memory cell, without encountering any process variation, by setting the capacity level of a reference cell at an intermediate level of the capacity level of the ordinary memory cell and comparing the capacity level of the reference cell and that of the ordinary cell.

Reference numeral 21 in FIG. 3 shows the size of one memory cell and, here, the following definition is given with reference to FIG. 5. The minimum line width 25 of the conductive layer, minimum layer-to-layer space 26 and minimum step pitch (minimum unit upon size variation) are given as $\lambda$, $\lambda$ and $\lambda/10$, respectively.

When a 2-bit/cell data configuration is to be achieved, it will be necessary to prepare capacitors corresponding to 7 levels in all, that is, 4 levels for the ordinary cell and 3 levels for the reference cell. The capacity level of the capacitor, that is, the data of the memory cell, is programmed by varying the width of the lateral word line (WL) as shown in FIG. 3. In this case the memory cell size is expressed as follows, provided that the bit line (BT) pitch is set to be minimal.

$$(\lambda + (\lambda/10) \times 6 + \lambda) \times (\lambda + \lambda) = 5.2\lambda^2 \quad (1)$$

The per-bit area of the memory cell becomes $$5.2\lambda^2/2 = 2.6\lambda^2 \quad (2)$$

In a conventional memory cell, one transistor per cell is required at least and, hence, a per-bit memory cell size is not made smaller than the size of one transistor. A minimal area with which one transistor is formed becomes $$2\lambda \times 2\lambda = 4\lambda^2.$$

In consequence, the per-bit area of a 2-bits/cell configuration can be achieved with below 65% of a conventional per-bit area, that is, $$2.6\lambda^2/4\lambda^2 = 0.65.$$

Similarly, in order to achieve a 3 bit/cell configuration, capacitors corresponding to 15 levels in all are required with 8 levels for the ordinary cell and 7 levels for the reference cell; a 4-bit/cell configuration, capacitors corresponding to 31 levels in all with 16 levels for the ordinary cell and 15 levels for the reference cell; a 5 bit/cell configuration, capacitors corresponding to 63 levels in all with 32 levels for the ordinary cell and 31 levels for the reference cell; and a 6 bit/cell configuration, capacitors corresponding to 127 levels in all with 64 levels for the ordinary cell and 63 levels for the reference cell. The result is given below through computation.

| | memory cell size | per-bit area | Comparison with per-bit area for a conventional case |
|---|---|---|---|
| 3 bits/cell | $6.8\lambda^2$ | $2.27\lambda^2$ | 56.7% |
| 4 bits/cell | $10.0\lambda^2$ | $2.50\lambda^2$ | 62.5% |
| 5 bits/cell | $16.4\lambda^2$ | $3.28\lambda^2$ | 82.0% |
| 6 bits/cell | $29.2\lambda^2$ | $4.87\lambda^2$ | 121.7% |

From the above it will be seen that the per-bit area ($2.27\lambda^2$) for the 3 bit/cell configuration is the smallest compared with the conventional per-bit area ($4\lambda^2$) and that the 3 bits/cell configuration is optimal to a large-capacity ROM.

Figure 6B:
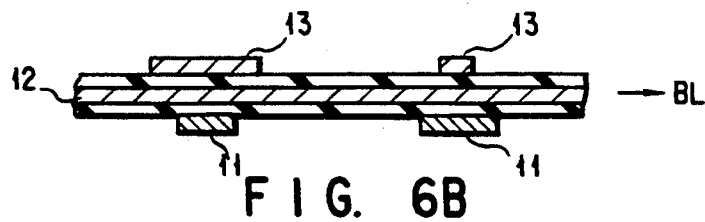
Figure 6C:
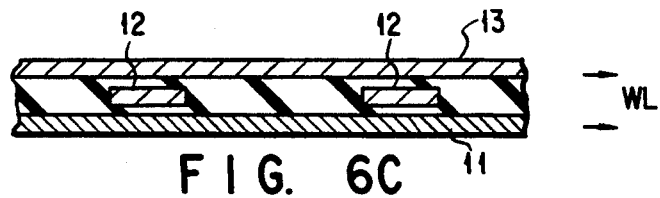

FIG. 6A is a plan view of a pattern showing a mask ROM memory cell in another embodiment of the present invention; FIG. 6B is a cross-sectional view taken along line 6B—6B in FIG. 6A; and FIG. 6C is a cross-sectional view taken along line 6C—6C. In this embodiment, conductive layers 13 are added to the arrangement shown in FIG. 3 such that they extend in a parallel relation to the lateral direction (word line WL direction) and overlie the conductive layers 12 and that the conductive layers 12 are interposed between the conductive layer 11 and the conductive layer 13 and extend in a parallel relation to the bit line BL direction. An insulating film 14 is provided between the conductive layers 11 and 12 and between the conductive layer 12 and 13 and a capacitor is formed at those areas of the mutually facing conductor layers.

Figure 7:
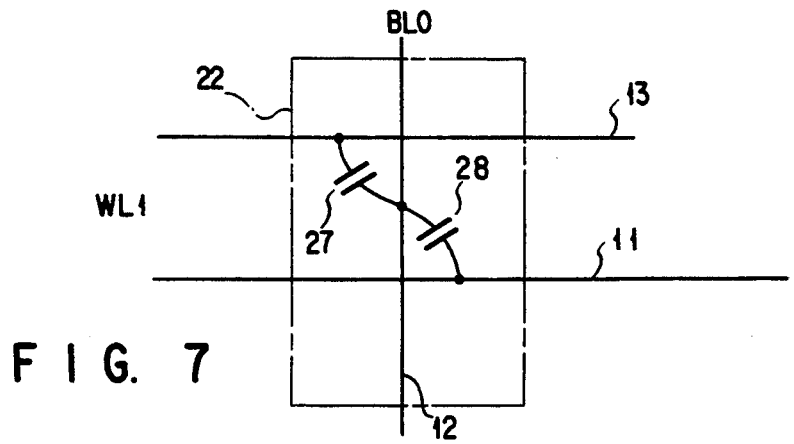
FIG. 7 is an equivalent circuit diagram showing part of the cell structure of FIG. 6A.

FIG. 7 is an equivalent circuit diagram of one memory cell surrounded with a dash dot line 22 in FIG. 6A. In this embodiment the bit lines 12 are interposed between the underlying and overlying word lines (conductive lines) 11 and 13. Further the respective widths of the word lines 11 and 13 at memory cell areas constituting capacitors can be independently set and, as a result, two capacitors 27 and 28 can be formed at one memory cell area, thus doubling a data storage amount per cell area in comparison with the arrangement shown in FIG. 3.

The present invention is not restricted to the aforementioned embodiments. For example, those bit lines (conductive layers 11 or 13) can be alternately stacked one over another with a word line (conductive layer 12) interposed. By so doing it is possible to provide a plural-stage of capacitors and hence to achieve a high-density memory cell structure.

Figure 8:
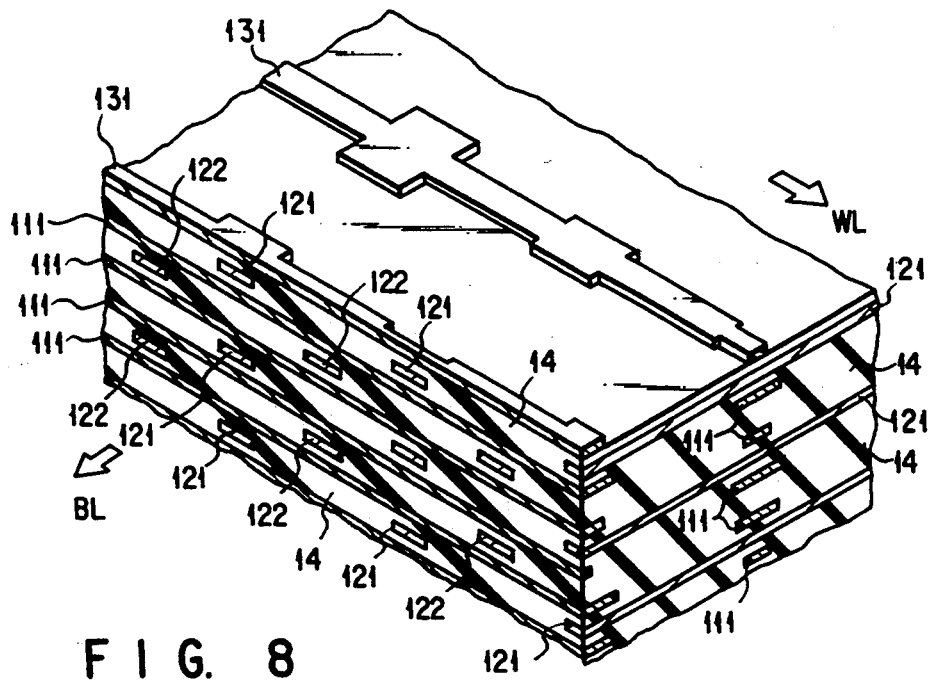
FIG. 8 is a cross-sectional view showing a high-density memory cell structure.

FIG. 8 is a cross-sectional view showing a high-density memory cell structure. Those bit lines (conductive layers 121 and 122) are alternately arranged with a word line (conductive layer 111) interposed such that these bit lines extend in a direction (BL direction) perpendicular to an extending direction (WL direction) of the conductive layers 111 with an insulating film 14 provided between the adjacent conductive layers (111, 121 and 122). The memory cell area of the conductive layer 111 is two times as great as that of a top layer (conductive layer 131) because the conductive layer 121 and corresponding memory cell area (capacitor formation area ) MA1 and conductive layer (122) and corresponding memory cell area (capacitor formation area) MA2 are provided as shown in FIG. 9.

As set out above, the memory cell is composed of a capacitor with the insulating film interposed between the diagonally crossing, non-contacting adjacent conductive layers. In this case, data can be obtained by detecting the static capacity of the capacitor and identifying that capacity level. It is thus possible to provide a mask ROM of a larger capacity than that of a conventional counterpart and hence to achieve a mask ROM memory cell with a multi-bit (plural-bit) data stored therein. It is also possible to provide a high-density ROM by forming a plurality of capacitors in one memory cell area.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A mask ROM for storing plural-bit data therein, comprising:
   first conductive layer means arranged in a parallel array in a first direction;
   a second conductive layer means arranged in a parallel array in a second direction orthogonal to the first direction;
   insulating film means for insulating the first and second conductive layer means from each other; and
   data storing means for defining a matrix array of capacitors formed at mutually facing areas of the first and second conductive layer means and each having a capacity level created by varying the area of the capacitor formed at the mutually facing areas of the first and second conductive layers, each capacitor defining a multi-bit storage region for a memory cell.

2. The mask ROM according to claim 1, wherein the first and second conductive layer means are multiple layers with the insulating film means provided between the first conductive layer means and the second conductive layer means.

3. The mask ROM according to claim 1, wherein the data storing means includes an ordinary data memory cell group and a reference memory cell group, the ordinary data memory cell group and reference memory cell group each comprising capacitors having a plurality of capacity levels defined by the mutually facing areas of the first and second conductive layer means, wherein the capacity level of each reference memory cell is set to a capacity level intermediate to that of a first and a second data memory cell.

4. The mask ROM according to claim 3, wherein the ordinary data memory cell group has memory cells having eight combinations of capacity levels and the reference memory cell group has memory cells having seven combinations of capacity levels.

5. A mask ROM for storing plural-bit data therein, comprising:
   first conductive layer means arranged in a first direction;
   second conductive layer means arranged in parallel array in a second direction orthogonal to the first direction;
   insulating film means provided between the first and second conductive layers; and
   capacitor array means for defining a matrix array of capacitors at a corresponding mutually faced area of the first and second conductive layer means, wherein each of the capacitors has a predetermined multi-bit capacity level and wherein the predetermined capacity levels of the capacitors is determined by the corresponding mutually facing area.

6. The mask ROM according to claim 5, wherein the first and second conductive layer means are multiple layers with the insulating film means provided between the corresponding associated first and second conductive layer means.

7. The mask ROM according to claim 5, wherein said capacitors include a first capacitor group having a plurality of different storage capacitance levels for plural-bit data and a second capacitor group having a plurality of reference capacitance levels,
   wherein each of the reference capacitance levels lies between a first and a second of the different storage capacitance levels for plural-bit data.

8. The mask ROM according to claim 7, wherein the first capacitor group has eight combinations of capacity levels and the second capacitor group has seventh combinations of capacity levels.

9. A mask ROM for storing plural-bit data comprising:
   a first ROM storage cell having a lower level conductor and an upper level conductor, wherein said first ROM storage cell is characterized by a first storage capacitance level;
   a second ROM storage cell having a lower level conductor and an upper level conductor, wherein said second ROM storage cell is characterized by a second storage capacitance level;
   a third ROM storage cell having a lower level conductor and an upper level conductor, wherein said third ROM storage cell is characterized by a third storage capacitance level, wherein each of the first, second and third storage capacitance levels are different by a substantially large amount to identify different respective data storage conditions in each of the first, second and third ROM storage cells; and
   a fourth ROM storage cell having a lower level conductor and an upper level conductor, wherein the fourth ROM storage cell is characterized by a fourth storage capacitance level, wherein the fourth storage capacitance level is different from each of the first, second and third storage capacitance levels by a substantially large amount to identify a data storage condition different from that of each of the first, second and third ROM storage cells.

10. The mask ROM of claim 9 further comprising:
    a first reference capacitor characterized by a first reference capacitance level, wherein the first reference capacitance is greater than the first storage capacitance level and less than the second storage capacitance level;
    a second reference capacitor characterized by a second reference capacitance level, wherein the second reference capacitance is greater than the second storage capacitance level and less than the third storage capacitance level; and a third reference capacitor characterized by a third reference capacitance level, wherein the third reference capacitance is greater than the third storage capacitance level and less than the fourth storage capacitance level.

11. The mask ROM of claim 10 wherein the first storage capacitance level corresponds to a size differential between a portion of the upper level conductor and the lower level conductor of the first ROM storage cell.

12. The mask ROM of claim 10 wherein the upper level conductor of the first storage capacitance cell is displaced both laterally and vertically away from the upper level conductor of the second storage capacitance cell.

13. A mask ROM for storing plural-bit data comprising:

a first ROM storage cell having a lower level conductor and an upper level conductor, wherein said first ROM storage cell is characterized by a first storage capacitance level;

a second ROM storage cell having a lower level conductor and an upper level conductor, wherein said second ROM storage cell is characterized by a second storage capacitance level;

a third ROM storage cell having a lower level conductor and an upper level conductor, wherein said third ROM storage cell is characterized by a third storage capacitance level, wherein each of the first, second and third storage capacitance levels are different by a substantially large amount to identify different respective data storage conditions in each of the first, second and third ROM storage cells;

a first reference capacitor characterized by a first reference capacitance level, wherein the first reference capacitance is greater than the first storage capacitance level and less than the second storage capacitance level; and a second reference capacitor characterized by a second reference capacitance level, wherein the second reference capacitance is greater than the second storage capacitance level and less than the third storage capacitance level.

* * * * *